United States Patent [19]
Evans

[11] Patent Number: 5,438,236
[45] Date of Patent: Aug. 1, 1995

[54] GAS DISCHARGE DISPLAY HAVING PRINTED CIRCUIT BOARD MEMBERS AND METHOD OF MAKING SAME

[75] Inventor: Curtiss W. Evans, Overland Park, Kans.

[73] Assignee: AlliedSignal Inc., Morris Township, N.J.

[21] Appl. No.: 285,325

[22] Filed: Aug. 3, 1994

[51] Int. Cl.$^6$ ............................. H01J 17/49
[52] U.S. Cl. ..................... 313/582; 313/491; 313/574; 313/584; 313/631; 313/292; 361/748
[58] Field of Search ............... 313/582, 491, 492, 574, 313/584, 631, 637, 292; 315/169.4; 345/37, 41, 60, 75; 361/748, 760, 772

[56] References Cited

U.S. PATENT DOCUMENTS

| | | | |
|---|---|---|---|
| 3,743,879 | 7/1973 | Kupsky | 313/484 |
| 3,983,445 | 9/1976 | Yasuda et al. | 313/485 |
| 4,182,553 | 1/1980 | Sheridan | 313/584 X |
| 4,320,418 | 3/1982 | Pavliscak | 313/584 |
| 4,340,838 | 7/1982 | Kobale et al. | 313/105 CM |
| 4,341,976 | 7/1982 | Hanlet | 313/491 X |
| 4,388,550 | 6/1983 | de Vries | 313/585 |
| 5,001,393 | 3/1991 | Kim | 313/586 |
| 5,066,257 | 11/1991 | Farner et al. | 445/26 |
| 5,182,489 | 1/1993 | Sano | 313/584 X |
| 5,260,624 | 11/1993 | Kim et al. | 313/584 X |

*Primary Examiner*—Walter E. Snow
*Assistant Examiner*—Ashok Patel
*Attorney, Agent, or Firm*—Howard G. Massung

[57] ABSTRACT

A gas discharge display having a base member, a spacer member, an electrode member and a window sealed to each other to form a gas tight structure. The base member, spacer member and electrode member are made from copper clad printed circuit boards and are fabricated using existing printed circuit board technology. The spacer member and electrode member have a matrix of holes aligned with each other along orthogonal rows and columns. Parallel lower electrodes are provided on the surface of the base member aligned with either the rows or columns. Cylindrical upper electrodes are provided in the holes of the electrode member and are connected to each other by parallel electrical connectors provided on the surface of the electrode member orthogonal to the parallel electrodes on the base member. The display is sealed with an ionizable gas contained within the holes of the spacer and electrode members.

9 Claims, 3 Drawing Sheets

GAS DISCHARGE DISPLAY HAVING PRINTED CIRCUIT BOARD MEMBERS AND METHOD OF MAKING SAME

TECHNICAL FIELD

The invention is related to the field of gas discharge displays and in particular to a gas discharge display using printed circuit boards and printed circuit board technology.

BACKGROUND ART

Various forms of gas discharge displays have been developed over the years. These gas discharge displays may have a single glass or ceramic plate having a matrix of holes provided therethrough as taught by Kupsky in U.S. Pat. No. 3,743,879. In the display taught by Kupsky, a solid lower electrode is disposed at one end of the holes while an annular upper electrode is circumscribes each of the holes. The holes are filled with an ionizable gas which produces a glow discharge when a sufficiently high voltage gradient is provided between the lower and upper electrodes. Yasud, et al in U.S. Pat. No. 3,983,445 teach a gas discharge display in which has an upper insulator plate having an array of through holes. The upper annular electrodes are provided at the lower surface of the insulator plate and the lower electrodes are disposed a small distance below the upper electrodes. The glow discharge is generated in a common region below the insulator plate.

The problems associated with these displays is that the upper and lower electrodes are relatively thin vacuum coated layers on glass or ceramic substrates. These thin electrodes have limited electrical current carrying capacity and may be readily damaged by the currents encountered during the gas discharge. The invention overcomes this limitation by using copper clad printed circuit boards having increased current carrying capacity.

SUMMARY OF THE INVENTION

A gas discharge display having a spacer member having a first matrix of holes provided therethrough along equally spaced rows and columns. A base member is fused to one side of the spacer member. The base member has a plurality of parallel electrodes adjacent to the spacer member, each of the parallel electrodes being aligned with one of the rows or columns of holes in the spacer member. An electrode member is fused to the spacer member on the side opposite the base member. The electrode member has a matrix of holes provided therethrough, each hold in the electrode member being aligned with a hole in the spacer member. A conductive cylindrical electrode is provided in each hole of the electrode member and a plurality of parallel connectors provided on the surface of the electrode member orthogonal to the parallel electrodes provided on the base member, each parallel connector electrically connecting the cylindrical electrodes along an associated row or column of holes.

The window has a photoluminescent phosphor disposed on the surface facing the electrode member and an ionizable gas is disposed inside the display filling the holes in the spacer and electrode members and the space between the electrode member and the window.

The spacer member, electrode member and base member are preferably made from printed circuit boards. The printed circuit boards used in the fabrication of the electrode and base members are copper clad. The copper cladding is selectively removed from the base member to form the parallel electrodes and the cooper cladding is selectively removed from the electrode member to form the electrical connectors. The cylindrical electrodes are formed by electroless plating a copper layer on the internal surfaces of the holes in the electrode member.

One advantage of the gas discharge panel is that it can be fabricated using existing printed circuit technology.

Another advantage of the gas discharge panel is that the base, spacer and electrode members can be directly fused to each other to form a gas tight structure without using adhesives or cements.

Yet another advantage of the gas discharge panel is that the thickness of the upper and lower electrodes as well as the electrical connectors have a sufficiently low resistance to minimize their failure during a gas discharge.

Still another advantage of the gas discharge panel is additional printed circuit boards with conventional circuitry, such as a controller circuit, may be added to the base member to enhance the connections between the display and its controller. This method reduces the electrical connections between the controller and the display by several orders of magnitude.

These and other advantages of the gas discharge panel will become more apparent from a reading of the specification in conjunction with the drawings.

BEST MODE FOR CARRYING OUT THE INVENTION

Figure 1:
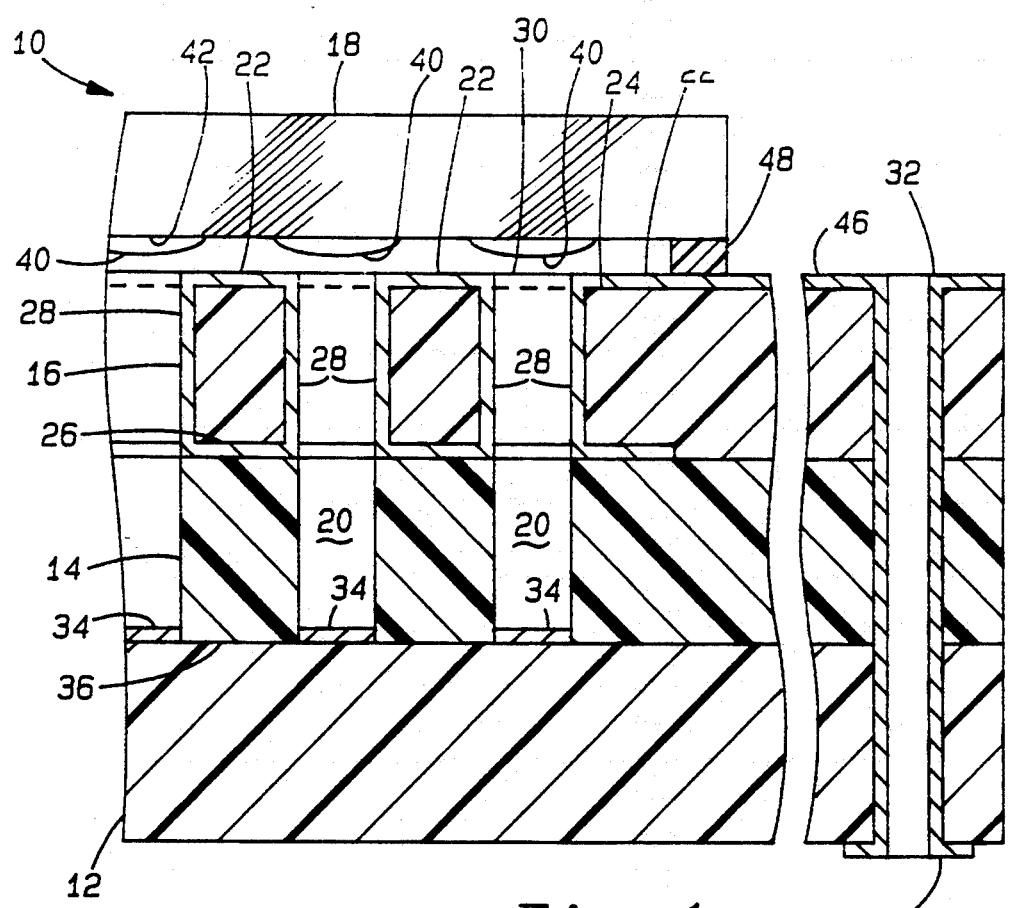
FIG. 1 is a partial cross-sectional side view of a first embodiment of the gas discharge display.
Figure 3:
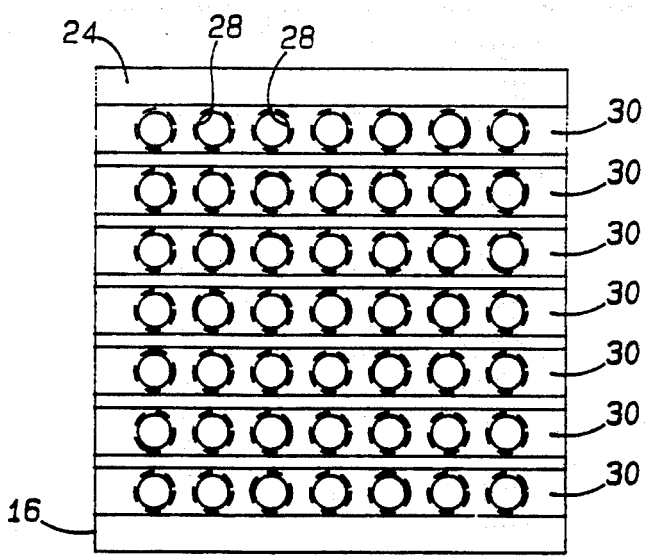
FIG. 3 is a top view of the electrode member.
Figure 4:
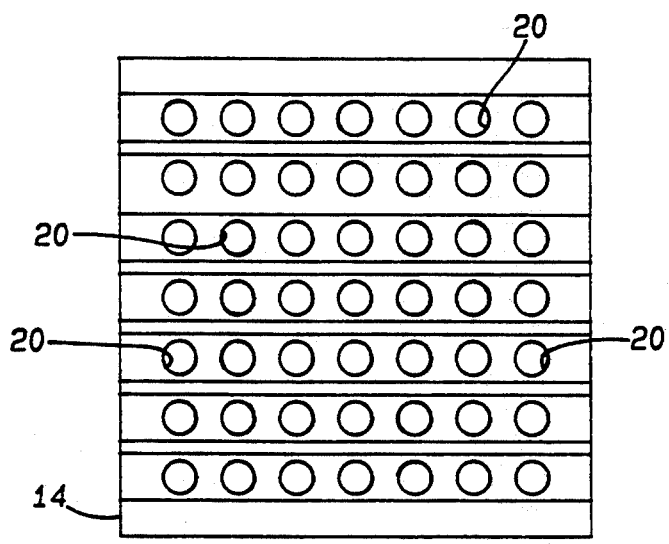
FIG. 4 is a top view of the spacer member.
Figure 5:
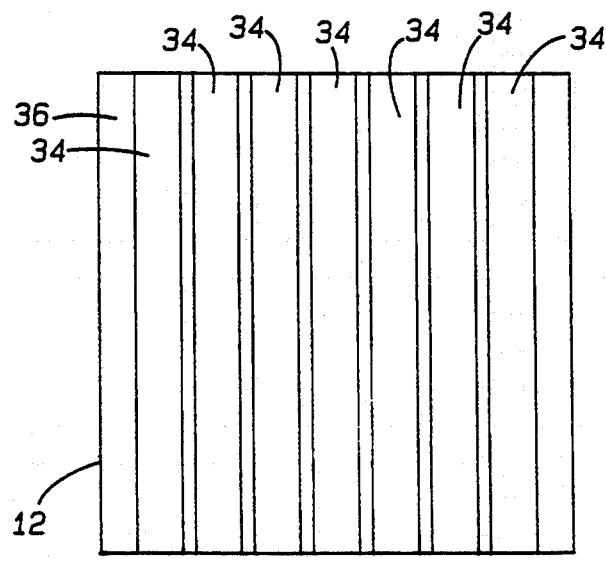
FIG. 5 is a top view of the base member.

FIG. 1 is a partial cross-sectional view showing the structure of the rim firing gas discharge display 10. The rim firing gas discharge display 10 consists of a base member 12, a spacer member 14, an electrode member 16 and a window 18. The spacer member 14 and the electrode member 16 have a matrix of through holes 20 symmetrically located along orthogonally disposed rows and columns as shown in FIGS. 3 and 4. The holes 20 provided through the spacer member 14 and the upper electrode member 16 are axially aligned and may be of any appropriate diameter. Preferably the holes 20 have a diameter in the range from 0.001 to 0.25 millimeters ($10^{-5}$ to $10^{-2}$ inches) and their centers are separated along the rows and columns by a distance approximately equal to twice their diameter.

The holes 20 along each row of holes of the electrode member 16 are connected by a metallic layer 22 provided along the upper surface 24 of the electrode member 16. The metallic layer 22 is plated through the holes 20 and preferably, but not necessarily, extend into the lower surface 26 of the electrode member.

The portion of the metallic layer 22 plated on the internal surfaces of the holes 20 form cylindrical electrodes 28 coaxial with the holes in the spacer member 14.

Figure 6:
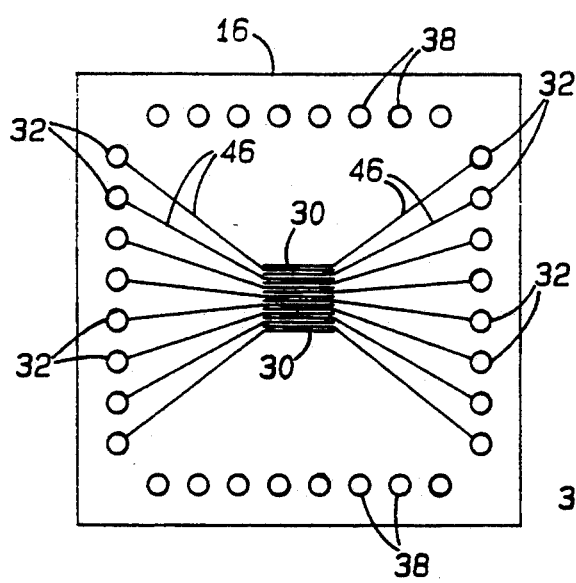
FIG. 6 is a top view of the electrode member having leads from the electrical connectors to edge terminals.

The metallic layer 22 provided on the upper surface 24 is in the form of a plurality of parallel electrical connectors 30. Each electrical connector 30 connects the cylindrical electrodes 28 of a single row of the holes 20, as shown in FIG. 3. Each row of holes has its own electrical connector 30 and each electrical connector is electrically isolated from the electrical connectors 30 associated with adjacent rows of holes. Electrical leads 46 extend to an external edge of the electrode member 16 where they are connected to discrete electrical terminals 32 as shown in FIG. 6.

Figure 8:
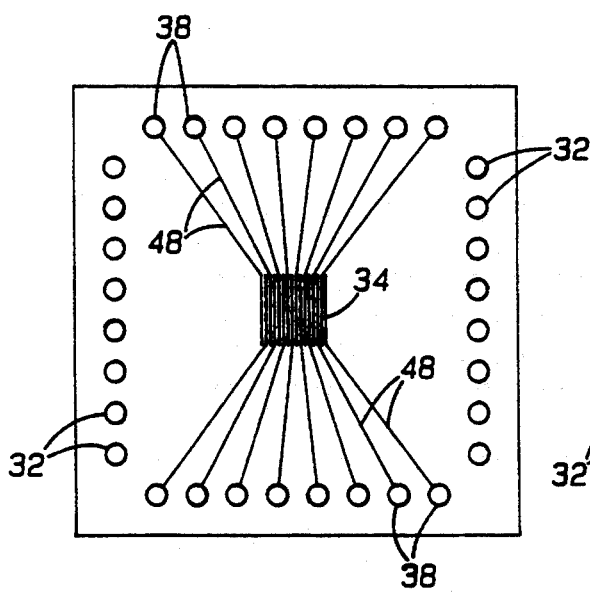
FIG. 8 is a top view of the base member having leads from the parallel electrodes to edge terminals.

The base member 12 has a series of parallel lower electrodes 34 provided along its upper or internal surface 36. The lower electrodes 34 are oriented orthogonal to the electrical connectors 30 and are aligned with the holes 20 provided through the spacer member 14 and the electrode member 16. Preferably, the width of the lower electrodes is substantially equal to the diameter of the holes 20 in the spacer member 14 and the holes 20 in the spacer member 14 and in the electrode member 16 are slightly misaligned to present a sharp edge to reduce the voltage at which a discharge will occur. In the preferred embodiment, the lower electrodes 34 include leads 48 which extend to the edge of the base substrate 12, and are connected to a terminal 38 as shown in FIG. 8. As is known in the art, the electrical connectors 30 may connect the cylindrical electrodes 28 along the columns and the lower electrodes may be oriented along the rows.

Figure 2:
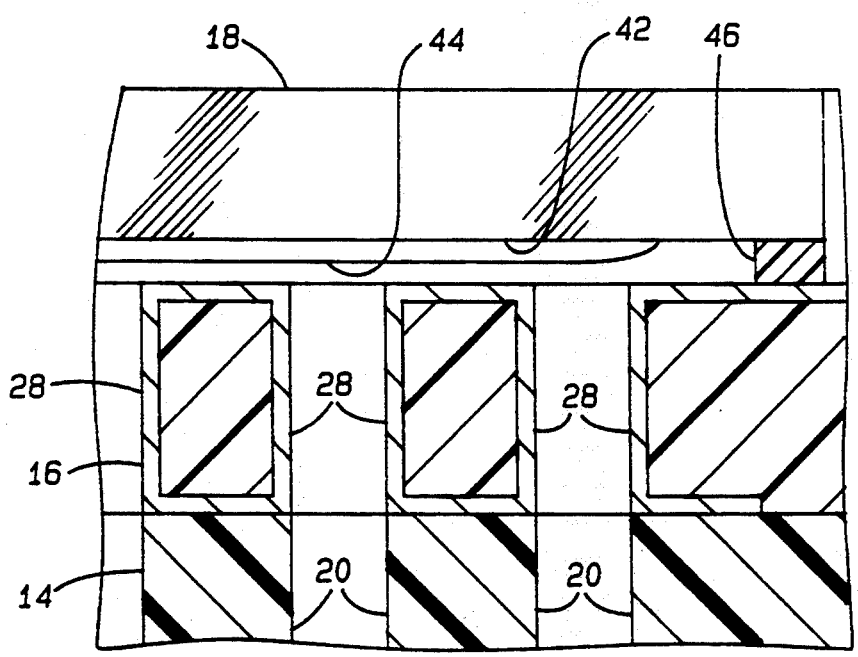
FIG. 2 is a partial cross-sectional side view of an alternate embodiment of the gas discharge display panel.

The window 18 is disposed adjacent to the electrode member 16 and is separated a small distance therefrom. An ultraviolet photoluminescent phosphor 40 is provided on the surface 42 of the window facing the electrode member 16. The photoluminescent phosphor 40 may be provided as a matrix of dots arranged in columns and rows and aligned with the holes in the electrode member 16, as shown in FIG. 1, may be in the form of stripes aligned with the rows or columns of holes, or a continuous layer of phosphor 44 extending the length and width of the rows and columns of holes as shown in FIG. 2.

The phosphor dots or stripes 40 may be made of different phosphor materials such that they generate different colors such as magenta, green and cyan used in color picture cathode ray tubes. This will give the gas discharge display the capability to produce color images in much the same way as a color T.V. picture tube.

The window 18 is sealed about its periphery to the electrode member 16 using glass beads as the spacers and a sealing adhesive 50 having low outgassing characteristics. A sealing adhesive, such as SCOTCH-WELD DP420 manufactured by the Industrial Tape and Specialties Division of the 3M Corporation of St. Paul Minn., is suitable for sealing the window 18 to the electrode member 16. The glass beads produce the desired separation between the window 18 and the top surface of the electrode member 16.

The base member 12, the spacer member 14 and the electrode member are made from glass reinforced TEFLON printed circuit (PC) boards manufactured by Northflex Oaks, a division of Allied Signal of Morristown, N.J. These PC boards have a thickness in the range from 5 to 12 mm. and are copper clad on both sides. Using conventional PC board fabrication techniques well-known in the art, the desired portions of the copper cladding can be selectively removed leaving a copper traces for the electrical connectors 30, the lower electrodes 34, and leads 46 and 48. The cylindrical electrodes 28 are then formed by electroless copper plating through the holes 20 of the electrode member 16. The copper electrical connectors and electrodes are subsequently coated with nickel and gold layers.

The base member 12, the spacer member 14, and the electrode member 16 are directly fused to each other at a temperature of approximately 332° C. (650° F.) and a pressure of 340 kg (75 lbs) for approximately 30 minutes to form a vacuum tight seal between these members. The window is sealed to the fused structure using the glass beads and the SCOTCH WELD adhesive as previously described.

The gas discharge display is filled with an atmosphere conducive to the formation of a gas discharge. This gas discharge produces ultraviolet light activating the phosphor dots 40, the stripes or phosphor layer 42 in the region adjacent to the cylindrical electrodes 28. The interior of the gas discharge display may be filled with neon, argon, xenon, helium or any other gas or gas mixture capable of producing the desired gas discharge.

Figure 7:
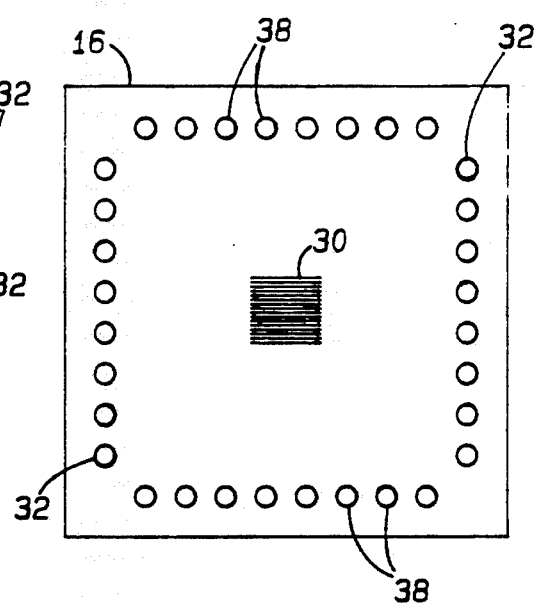
FIG. 7 is a bottom view of the electrode member.

FIG. 6 shows the pattern of the electrical connectors 30 formed on the upper surface 24 of the electrode member 16. As previously indicated the electrical connector 30 associated with each row of holes have a connector lead 44 extending to the edge of the printed circuit board. Each connector lead 44 terminates in a respective electrical terminal 32. FIG. 7 shows the preferred metal pattern formed on the lower surface 26 of the electrode member.

Figure 9:
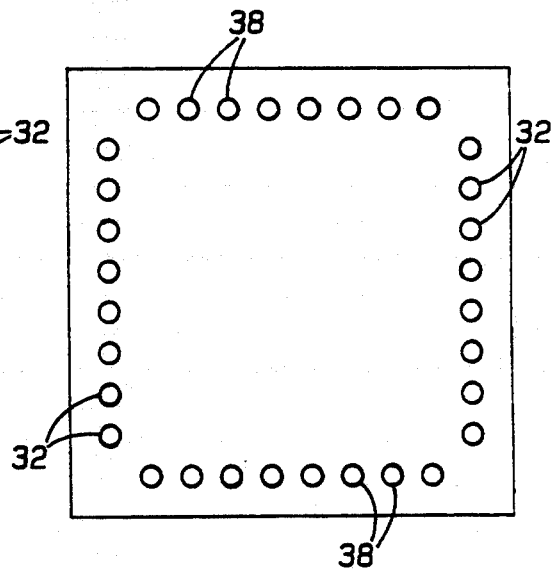
FIG. 9 is a bottom view of the base member.

FIG. 8 shows the pattern of the lower electrodes 34 formed on the upper surface 36 of the base member 12 and the leads 46 connection of these lower electrodes 34 to the terminals 38. FIG. 9 shows the bottom surface of the base member 12 which only has the terminals 38.

Since the base member 12 is a printed circuit board, additional circuit boards may be added which have conventional circuitry which is connected to terminals 32 and 38. This overcomes the high density connection limitation between the display and a controller. By using this method, the number of interconnections between the display and the controller may be reduced by several orders of magnitude.

It is intended that the invention not be limited to the specific embodiments illustrated in the drawings and discussed in the specification. It is recognized that others skilled in the art may make certain changes or improvement in the disclosed gas discharge display without departing from the invention as set forth in the appended claims.

What is claimed is:

1. A gas discharge display comprising:
    a spacer member having a first matrix of holes provided therethrough along equally spaced rows and columns;
    a base member fused to said spacer member to form a vacuum tight seal therebetween, said base member having a plurality of parallel electrodes provided on a surface thereof adjacent to said spacer member, each electrode of said parallel electrodes aligned with a selected one of said columns;
    an electrode member fused to said spacer member to form a vacuum tight seal therebetween, said electrode member having a second matrix of holes provided therethrough each hole of said second matrix of holes being axially aligned with a respective one hole of said first matrix of holes;

a conductive cylindrical electrode provided on the internal surface of each hole provided through said electrode member;

a plurality of parallel electrical connectors provided on a surface of said electrode member orthogonal to said parallel electrodes, each of said parallel electrical connectors electrically connecting said cylindrical electrodes along a respective one of said rows;

a window having a photoluminescent phosphor disposed thereon, said window spaced a predetermined distance from a surface of said electrode member, said photoluminescent phosphor facing said electrode member;

means for sealing said window to said electrode member; and an ionizable gas disposed inside said first and second matrix of holes and between said window and said electrode member.

2. The gas discharge display claim 1 wherein said spacer member, said base member and said electrode member are fiberglass reinforced TEFLON printed circuit boards.

3. The gas discharge display of claim 2 wherein said fiber glass reinforced TEFLON printed circuit boards are copper clad on both sides, said spacer member has said copper cladding removed from both sides, said copper clad on said electrode member is selectively removed to form said parallel electrical connectors and said copper cladding on said base member is selectively removed to form said parallel electrodes.

4. The gas discharge display of claim 3 wherein said cylindrical electrodes are copper layers electroless plated through said holes.

5. The gas discharge display of claim 1 wherein said photoluminescent phosphor is a matrix of phosphor dots disposed on said window, each phosphor dot aligned with a respective one of said second matrix of holes provided through said electrode member.

6. The gas discharge display of claim 1 wherein said spacer member, said electrode member and said base member have a substantially rectangular shape, said electrode member further comprising at least a first set of electrical terminals provided along at least one edge thereof and a first series of electrical leads connecting each of said electrical connectors to a respective one of said first set electrical terminals and wherein said base member has at least a second series of electrical terminals and a second series of electrical leads connecting each of said parallel electrodes to a respective one of said second set of electrical terminals.

7. The gas discharge display of claim 4 wherein said cylindrical electrodes and said electrical connectors have at least a layer of nickel disposed thereon.

8. The gas discharge display of claim 7 further comprising a layer of gold disposed of said layer of nickel.

9. The gas discharge display of claim 6 further comprising at least one printed circuit board attached to said base member, said at least one printed circuit board containing at least one electrical circuit connected to said first and second set of electrical terminals.

* * * * *